(12) United States Patent
Kurz et al.

(10) Patent No.: US 8,617,940 B2
(45) Date of Patent: Dec. 31, 2013

(54) SOI DEVICE WITH A BURIED INSULATING MATERIAL HAVING INCREASED ETCH RESISTIVITY

(75) Inventors: Andreas Kurz, Dresden (DE); Roman Boschke, Dresden (DE); Christoph Schwan, Dresden (DE); John Morgan, Dresden (DE)

(73) Assignee: Advanced Micro Devices, Inc., Sunnyvale, CA (US)

( * ) Notice: Subject to any disclaimer, the term of this patent is extended or adjusted under 35 U.S.C. 154(b) by 960 days.

(21) Appl. No.: 12/639,515

(22) Filed: Dec. 16, 2009

(65) Prior Publication Data

US 2010/0163994 A1    Jul. 1, 2010

(30) Foreign Application Priority Data

Dec. 31, 2008    (DE) .......................... 10 2008 063 403

(51) Int. Cl.
*H01L 29/66*    (2006.01)
(52) U.S. Cl.
USPC ......................................................... 438/151
(58) Field of Classification Search
USPC .................................. 257/347; 438/149–152
See application file for complete search history.

(56) References Cited

U.S. PATENT DOCUMENTS

| 6,407,429 | B1 | 6/2002 | Ko et al. ........................ 257/350 |
| 6,611,024 | B2 * | 8/2003 | Ang et al. ...................... 257/350 |
| 7,361,534 | B2 * | 4/2008 | Pelella ........................... 438/152 |
| 7,741,164 | B2 * | 6/2010 | Pelella ........................... 438/155 |
| 7,943,442 | B2 * | 5/2011 | Gehring et al. ................ 438/152 |
| 2004/0099910 | A1 * | 5/2004 | Choe et al. ..................... 257/347 |
| 2006/0170044 | A1 * | 8/2006 | Tu .................................. 257/347 |
| 2007/0063279 | A1 | 3/2007 | Tolchinsky et al. ........... 257/347 |
| 2008/0017906 | A1 * | 1/2008 | Pelella et al. .................. 257/306 |
| 2008/0268585 | A1 * | 10/2008 | Gehring et al. ................ 438/152 |
| 2008/0286967 | A1 | 11/2008 | Good et al. .................... 438/671 |

FOREIGN PATENT DOCUMENTS

| DE | 112006001169 T5 | 3/2008 | ............. H01L 21/84 |
| DE | 102007004859 A1 | 8/2008 | ............ H01L 21/822 |

OTHER PUBLICATIONS

Translation of Official Communication from German Patent Office for German Patent Application No. 10 2008 063 403.4 dated Oct. 23, 2009.
Translation of Official Communication from German Patent Office for German Patent Application No. 10 2008 063 403.4 dated Jan. 10, 2013.

* cited by examiner

*Primary Examiner* — Nathan Ha

(57) ABSTRACT

In SOI devices, the PN junction of circuit elements, such as substrate diodes, is formed in the substrate material on the basis of the buried insulating material that provides increased etch resistivity during wet chemical cleaning and etch processes. Consequently, undue exposure of the PN junction formed in the vicinity of the sidewalls of the buried insulating material may be avoided, which may cause reliability concerns in conventional SOI devices comprising a silicon dioxide material as the buried insulating layer.

20 Claims, 9 Drawing Sheets

SOI DEVICE WITH A BURIED INSULATING MATERIAL HAVING INCREASED ETCH RESISTIVITY

BACKGROUND OF THE INVENTION

1. Field of the Invention

Generally, the present disclosure relates to integrated circuits, and, more particularly, to semiconductor elements, such as substrate diodes, of SOI circuits formed in the crystalline material of the substrate.

2. Description of the Related Art

The fabrication of integrated circuits requires a large number of circuit elements, such as transistors and the like, to be formed on a given chip area according to a specified circuit layout. Generally, a plurality of process technologies are currently practiced, wherein, for complex circuitry, such as microprocessors, storage chips, ASICs (application specific ICs) and the like, CMOS technology is currently one of the most promising approaches due to the superior characteristics in view of operating speed and/or power consumption and/or cost efficiency. During the fabrication of complex integrated circuits using CMOS technology, millions of complementary transistors, i.e., N-channel transistors and P-channel transistors, are formed above a substrate including a crystalline semiconductor layer. A MOS transistor, irrespective of whether an N-channel transistor or a P-channel transistor is considered, comprises so-called PN junctions that are formed by an interface of highly doped drain and source regions with an inversely or weakly doped channel region disposed between the drain region and the source region. The conductivity of the channel region, i.e., the drive current capability of the conductive channel, is controlled by a gate electrode formed above the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially determines the performance of MOS transistors. Thus, the latter aspect renders the reduction of the channel length, and associated therewith the reduction of the channel resistivity, a dominant design criterion for accomplishing an increase in the operating speed of the integrated circuits.

In view of further enhancing performance of transistors, in addition to other advantages, the SOI (semiconductor or silicon on insulator) architecture has continuously been gaining in importance for manufacturing MOS transistors due to their characteristics of a reduced parasitic capacitance of the PN junctions, thereby allowing higher switching speeds compared to bulk transistors. In SOI transistors, the semiconductor region, in which the drain and source regions as well as the channel region are located, also referred to as the body, is dielectrically encapsulated. This configuration provides significant advantages, but also gives rise to a plurality of issues. Contrary to the body of bulk devices, which is electrically connected to the substrate, and thus applying a specified potential to the substrate maintains the bodies of bulk transistors at a specified potential, the body of SOI transistors is not connected to a specified reference potential, and, hence, the body's potential may usually float due to accumulating minority charge carriers, unless appropriate counter measures are taken.

A further issue in high performance devices, such as microprocessors and the like, is an efficient device internal temperature management due to the significant heat generation. Due to the reduced heat dissipation capability of SOI devices caused by the buried insulating layer, the corresponding sensing of the momentary temperature in SOI devices is of particular importance.

Typically, for thermal sensing applications, an appropriate diode structure may be used wherein the corresponding characteristic of the diode may permit information to be obtained on the thermal conditions in the vicinity of the diode structure. The sensitivity and the accuracy of the respective measurement data obtained on the basis of the diode structure may significantly depend on the diode characteristic, i.e., on the diode's current/voltage characteristic, which may depend on temperature and other parameters. For thermal sensing applications, it may, therefore, typically be desirable to provide a substantially "ideal" diode characteristic in order to provide the potential for precisely estimating the temperature conditions within the semiconductor device. In SOI devices, a corresponding diode structure, i.e., the respective PN junction, is frequently formed in the substrate material located below the buried insulating layer, above which is formed the "active" semiconductor layer used for forming therein the transistor elements. Thus, at least some additional process steps may be required, for instance, for etching through the semiconductor layer or a corresponding trench isolation area and through the buried insulating layer in order to expose the crystalline substrate material. On the other hand, the process flow for forming the substrate diode is typically designed so as to exhibit a high degree of compatibility with the process sequence for forming the actual circuit elements, such as the transistor structures, without undue negative effects on the actual circuit elements.

In other cases, other circuit elements may have to be formed in the crystalline substrate material on the basis of appropriately designed PN junctions, while not unduly contributing to overall process complexity. Hence, the circuit elements to be formed in the substrate material may typically be fabricated with a high degree of compatibility with the usual manufacturing sequence for the circuit elements formed in and above the actual semiconductor layer formed on the buried insulating material. For instance, typically, the PN junctions of the circuit elements in the crystalline substrate material may be formed on the basis of implantation processes, which are also performed in the actual semiconductor layer for forming deep drain and source regions, in order to provide an efficient overall manufacturing flow. In this case, an opening is typically formed so as to extend through the buried insulating layer and into the crystalline substrate material prior to performing the corresponding implantation process. Consequently, the dopant species may be introduced into the crystalline substrate material, i.e., into the portion exposed by the opening, so that corresponding PN junctions may be substantially aligned to the sidewalls of the opening, thereby also providing a certain "overlap" due to the nature of the implantation process and any subsequent anneal processes that may typically be required for activating the dopant species in the drain and source regions of the transistors and also to re-crystallize implantation-induced damage. However, during the further processing of the semiconductor device, for instance by performing appropriate wet chemical etch and cleaning processes, the lateral dimension of the opening may be increased due to an interaction with aggressive wet chemical etch chemistries, which may also have a significant influence on corresponding PN junctions formed in the crystalline substrate material, as will be described in more detail with reference to FIGS. 1a-1c.

FIG. 1a schematically illustrates a cross-sectional view of a semiconductor device 100 in the form of an SOI device. The semiconductor device 100 comprises a substrate 101, which includes, at least in an upper portion thereof, a substantially crystalline substrate material 102, which may be pre-doped in accordance with device requirements. For example, the substrate material 102 may have incorporated therein an appropriate concentration of a P-type dopant and the like. In other cases, the crystalline substrate material 102 may comprise appropriately doped well regions as may be required for forming circuit elements, such as substrate diodes and the like. Furthermore, a buried silicon dioxide layer 103 (Box) is formed on the crystalline substrate material 102, followed by a semiconductor layer 104, typically provided in the form of a silicon layer, which may, however, also contain other components, such as germanium, carbon and the like, at least in certain device areas. For instance, the device 100 may comprise a first device region 110 and a second device region 120, wherein, in the first device region 110, one or more PN junctions 102P is provided in the crystalline substrate material 102, while, in the second device region 120, one or more circuit elements, such as transistors 121, are formed in and above the silicon layer 104. The PN junction 102P in the substrate material 102 may be substantially aligned to an opening 103A formed in the buried oxide layer 103 and also extending through the semiconductor layer 104, or any isolation region formed therein, depending on the overall device requirements.

Typically, the semiconductor device 100 as illustrated in FIG. 1a may be formed on the basis of the following processes. The substrate 101 may be provided so as to include the buried oxide layer 103 formed on the crystalline substrate material 102, while the semiconductor layer 104 is formed on the buried oxide layer 103, which may be accomplished on the basis of well-established wafer bond techniques, sophisticated implantation and oxidation processes and the like. Thereafter, isolation structures, such as shallow trench isolations (not shown), may be formed by using well-established lithography, etch, deposition and planarization techniques in order to obtain isolation trenches filled with an appropriate dielectric material, such as silicon dioxide. Thereafter, the basic dopant concentration in the corresponding active regions of the semiconductor layer 104 may be defined, for instance, by ion implantation and the like. Next, appropriate materials for a gate electrode structure 122 of the transistor 121 may be provided, for instance, by advanced oxidation and/or deposition techniques for providing an appropriate gate dielectric material, followed by the deposition of the gate electrode material, such as polysilicon and the like. On the basis of sophisticated lithography and etch techniques, the materials are patterned so as to obtain the gate electrode structure 122. Thereafter, appropriate implantation sequences may be performed in order to introduce a desired dopant concentration adjacent to the gate electrode structure 122, possibly on the basis of offset spacer elements (not shown). Thereafter, a sidewall spacer structure 123 is formed by well-established techniques, i.e., depositing an etch stop material (not shown) such as silicon dioxide, followed by the deposition of a silicon nitride material, which is then etched by anisotropic techniques in order to obtain the spacer structure 123. It should be appreciated that the spacer structure 123 may include two or more individual spacer elements, if a corresponding complex dopant profile may be required for drain and source regions 124 of the transistor 121. According to well-established process strategies, prior to defining the final dopant concentration of the drain and source regions 124, the opening 103A may be formed, which may be accomplished by appropriately covering the second device region 120 by an etch mask while defining the desired lateral size and position of the opening 103A in the first device region 110. Thereafter, an appropriate anisotropic etch process is performed, for instance, for etching through the semiconductor layer 104, if the opening 103A is to be formed through semiconductor material and the buried oxide layer 103, while, in other cases, when the opening 103A is enclosed by an isolation structure, the corresponding etch chemistry may be designed so as to etch through the dielectric material of the isolation structure and through the silicon dioxide material of the layer 103. After the etch process, the corresponding etch mask is removed and further processing is continued by performing an implantation process 105 in order to obtain the finally required dopant concentration for the drain and source regions 124. During the implantation process 105, the dopant species is introduced into the exposed portion of the substrate material 103 through the opening 103A so that a corresponding dopant concentration of the doped region 102B substantially corresponds to the dopant concentration of deep drain and source areas of the regions 124 of the transistor 121. Thereafter, typically, appropriately designed anneal processes are performed in order to activate the dopant species and also re-crystallize implantation-induced damage. Due to the nature of the implantation process 105 and due to the subsequent anneal processes, the PN junction 102P may be driven under the buried oxide layer 103, as indicated by the dashed line, wherein the degree of overlap of the layer 103 and the doped region 102B is determined by the process parameters of the previously-performed process sequence. Depending on the requirements for the dopant profile of the drain and source regions 124 of the transistor 121, a more or less pronounced degree of overlap may be created for the PN junctions 102P. Thereafter, further processing may be continued by performing further manufacturing steps as required for completing the basic transistor configuration. In particular, one or more sophisticated wet chemical cleaning or etch processes have to be performed in order to prepare exposed surface portions for the fabrication of a metal silicide in the drain and source regions 124 and possibly in the gate electrode structure 122.

FIG. 1b schematically illustrates the semiconductor device 100 during a corresponding wet chemical etch process 106, which is typically designed to remove oxide from exposed silicon surfaces in order to provide enhanced surface conditions during the subsequent silicidation process. Consequently, during the wet chemical process 106, exposed sidewall portions of the buried oxide layer 103 may be attacked and may be removed, thereby increasing the width of the opening 103A, as is indicated by the dashed lines. Consequently, the sidewalls 103S of the opening 103A, which previously acted as an implantation mask during the process 105 (FIG. 1a) thereby providing a desired dopant gradient at the PN junction 102P, may now expose a more or less pronounced portion of the doped region 102B, which may result in non-desirable characteristics of the PN junction or which may even result in a non-functional PN junction after the silicidation process.

FIG. 1c schematically illustrates the semiconductor device 100 in a further advanced manufacturing stage, in which metal silicide regions 125 are formed in the transistor 121 and a corresponding metal silicide region 115 is formed in the doped region 102B. Due to the preceding material removal at the sidewalls 103S, the metal silicide 115 may significantly extend into the PN junction region 102P and may even result in a short circuit at critical regions 102C, thereby resulting in a complete failure of a corresponding circuit element that requires the operational PN junction 102P for proper operation. Even if the metal silicide region 115 does not extend across the PN junction 102P in the critical areas 102C, a significant modification of the junction characteristics may result, which may significantly affect performance of the corresponding device, for instance a substrate diode, which relies on a predictable diode characteristic, which in turn is based on the design of the PN junction 102P.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides techniques and semiconductor devices in which superior PN junctions may be formed in the crystalline substrate material of SOI devices, while nevertheless providing a high degree of compatibility with manufacturing processes for forming transistor elements in the semiconductor layer formed above the buried insulating material. For this purpose, the buried insulating material may be provided in the form of material having, at least locally at the bottom of a corresponding opening exposing the crystalline substrate material, an enhanced etch resistivity with respect to a plurality of wet chemical cleaning or etch recipes, thereby significantly reducing the degree of receding of sidewall portions of a corresponding opening, at least at the bottom thereof. Consequently, in a subsequent silicidation process, undue "penetration" of the metal silicide material into the PN junction, previously formed, may be avoided or at least significantly reduced so that integrity of the PN junction may be maintained. The etch resistivity of the buried insulating material may be increased by using appropriate materials, at least locally within the buried insulating material, which may be accomplished during the manufacturing sequence for providing the buried insulating material and/or in a further advanced manufacturing stage, for instance, by incorporating appropriate species, for example by ion implantation, in order to at least locally modify the etch behavior of the buried insulating material. In some illustrative aspects disclosed herein, the buried insulating layer may comprise a low-k dielectric material, which is to be understood as a dielectric material having a dielectric constant of 3.0 or less, which may frequently have an intrinsic higher etch resistivity to a plurality of wet chemical etch recipes. Furthermore, the parasitic capacitance between the semiconductor layer and any circuit elements formed therein and the crystalline substrate material may be reduced, thereby even further enhancing overall performance of SOI devices.

One illustrative method disclosed herein relates to forming a semiconductor device. The method comprises providing a buried insulating layer formed above a crystalline substrate material at least in a first device region, wherein the buried insulating layer has an increased etch resistivity with respect to a wet chemical cleaning recipe to be performed prior to forming a metal silicide in the crystalline substrate material and in a semiconductor layer that is formed above the crystalline substrate material in at least a second device region. The method further comprises forming an opening through the buried insulating layer in the first device region to expose a portion of the crystalline substrate material. Additionally, the method comprises forming drain and source regions of a transistor in the semiconductor layer in the second device region and forming a doped region in the crystalline substrate material exposed in the opening in a common implantation process. Additionally, one or more cleaning processes are performed on the basis of the wet chemical cleaning recipe and a metal silicide is formed in the transistor and the doped region.

A further illustrative method disclosed herein comprises treating a surface portion of a crystalline substrate material of a semiconductor device by performing a wet chemical process, wherein the surface portion is exposed by an opening extending through a buried insulating layer to the crystalline substrate material. The method further comprises using at least a portion of the buried insulating layer as an etch protection material during the wet chemical process in order to maintain a width of the opening at least at a bottom thereof within a predefined range. Finally, the method comprises forming a metal silicide in the exposed portion of the crystalline substrate material.

One illustrative semiconductor device disclosed herein comprises a first crystalline semiconductor material comprising a doped region having formed therein a metal silicide. Furthermore, the semiconductor device comprises a buried insulating layer formed on the first crystalline semiconductor material and comprising an opening that extends to the metal silicide. The buried insulating layer further comprises, at least adjacent to the metal silicide, an etch protection material having a higher etch resistivity compared to silicon dioxide material. Additionally, the semiconductor device comprises a transistor formed in and above a second crystalline semiconductor material that is formed on a portion of the buried insulating layer.

BRIEF DESCRIPTION OF THE DRAWINGS

The disclosure may be understood by reference to the following description taken in conjunction with the accompanying drawings, in which like reference numerals identify like elements, and in which.

Figure 1A:
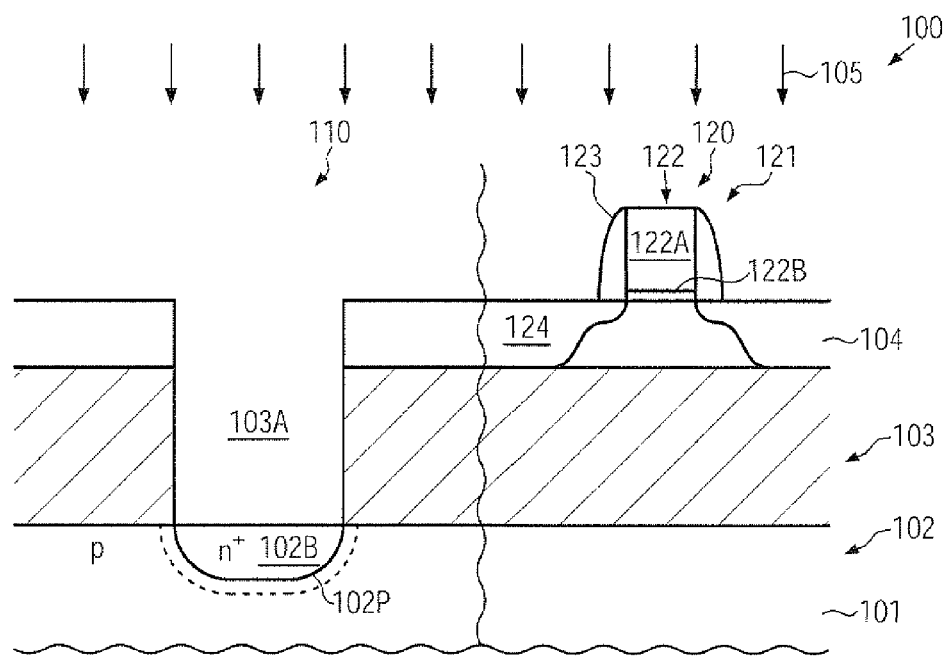
FIGS. 1a-1c schematically illustrate cross-sectional views of a conventional SOI device during various manufacturing stages in forming a PN junction in the crystalline substrate material together with drain and source regions of transistor elements on the basis of conventional techniques.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein provides techniques and semiconductor devices in which PN junctions, for instance as may be used for substrate diodes and the like, may be provided with enhanced reliability, while at the same time providing a high degree of process compatibility with conventional manufacturing strategies. That is, increased process robustness may be achieved after forming the PN junctions in the crystalline substrate material by providing at least a portion of the buried insulating material so as to exhibit a superior etch behavior during wet chemical cleaning and etch processes. Consequently, the lateral size of a corresponding opening extending to the crystalline substrate material may be affected, at least at the bottom of the opening, in a significantly less pronounced manner, thereby maintaining a desired degree of overlap of the PN junction with the overlying portion of the buried insulating material. Consequently, the subsequent silicidation may result in reliable PN junctions having predictable characteristics, thereby also contributing to superior performance of any circuit elements formed on the basis of the PN junction in the crystalline substrate material. On the other hand, well-established manufacturing strategies may still be used for forming the PN junction by using the patterned buried insulating material as an efficient implantation mask, while additionally providing enhanced flexibility in designing the subsequent manufacturing flow. For example, due to the enhanced etch resistivity of the buried insulating material, one or more well-established wet chemical etch or cleaning processes may be performed substantially without affecting the reliability and performance of the finally obtained PN junction. For instance, additional cleaning processes may be introduced when certain substrates have to be reworked in view of non-acceptable defect rates prior to performing the silicidation process. Consequently, production yield may be increased due to the superior degree of reworkability of substrates of increased defect rate, while additionally providing superior performance of the PN junction.

The superior etch resistivity of at least a portion of the buried insulating material may be accomplished by selecting an appropriate dielectric material, such as silicon nitride, silicon carbide, nitrogen-containing silicon carbide, which may have a significantly higher etch resistivity with respect to a plurality of well-established and efficient wet chemical cleaning recipes. For example, diluted hydrofluoric acid (DHF) is frequently used as a cleaning agent and may have a removal rate for silicon dioxide material of approximately 20-40 nm per minute, while a silicon nitride material may have a removal rate of approximately 10-20 nm per minute, thereby providing significantly increased process margins with respect to performing corresponding cleaning processes. These materials may be efficiently formed, for instance, prior to bonding appropriately designed substrates for obtaining the SOI configuration. In other cases, when SOI areas in a substrate may have to be formed on the basis of sophisticated implantation and anneal techniques, for instance by incorporating oxygen into the silicon material of the substrate, other species, such as carbon, nitrogen, fluorine and the like, may be incorporated to obtain a modified oxide-based material, which may exhibit the superior etch behavior. In still further illustrative embodiments disclosed herein, the buried insulating material may comprise a low-k dielectric material, i.e., a dielectric material having a dielectric constant of 3.0 or less, which a plurality of material compositions may be available that provide the superior etch behavior. For example, a material composition indicated by the formula SiCOH may exhibit a significantly increased etch resistivity compared to conventional silicon dioxide material when exposed to wet chemical agents. Furthermore, in this case, the electrical performance of circuit elements, such as transistors, may be increased, since the parasitic capacitance with respect to the crystalline substrate material may be reduced compared to dielectric materials, such as silicon dioxide, having a dielectric constant of approximately 5, and silicon nitride, having a dielectric constant of approximately 7.

In still other cases, additional advantages with respect to process robustness may be accomplished by providing a portion of the buried insulating material as an etch stop material, which may provide the superior etch resistivity during the wet chemical processes and which may also be used as an etch stop material during the patterning of the buried insulating material. In still other illustrative embodiments, the modification of the etch characteristics of the buried insulating material may be accomplished by using implantation processes, which may be performed as masked or non-masked processes, depending on the desired process strategy. For instance, in some cases, a mask may be formed to define the size and position of corresponding isolation structures, which may also be used as an implantation mask for locally modifying the etch characteristics of the buried insulating material. Consequently, in this case, a dedicated modification of the etch resistivity may be achieved without introducing implantation-induced damage in the semiconductor layer used for forming transistor elements in a later manufacturing stage.

Figure 1B:
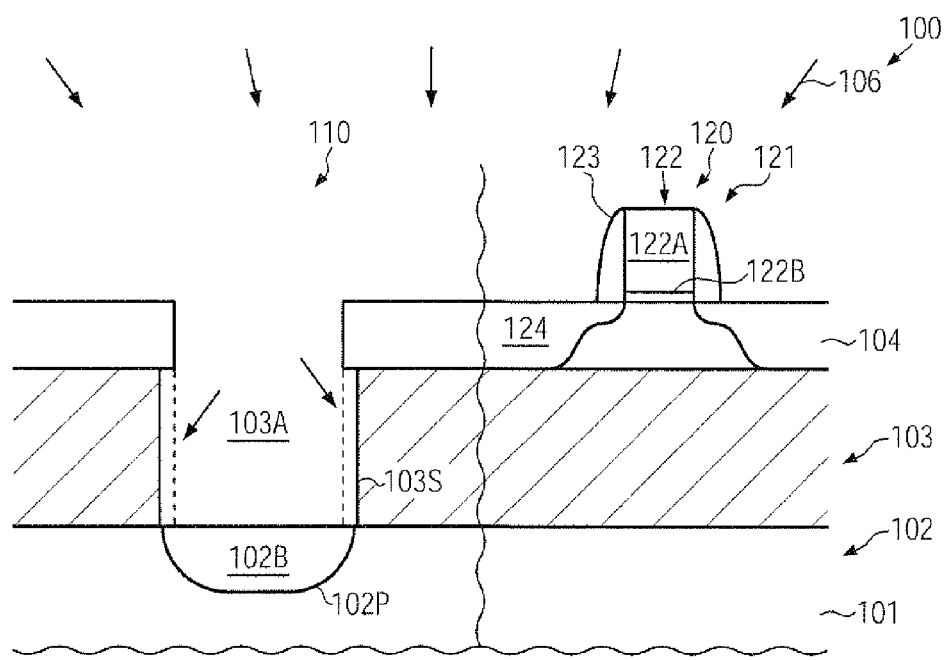
Figure 1C:
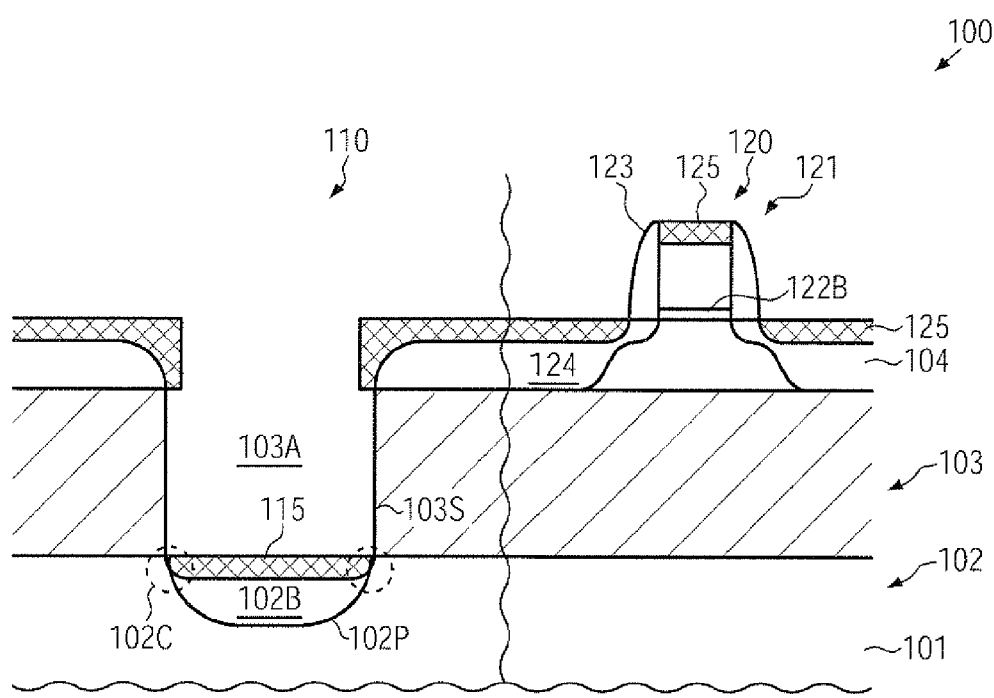

With reference to FIGS. 2a-2m, further illustrative embodiments will now be described in more detail, wherein reference may also be made to FIGS. 1a-1c, if required.

Figure 2A:
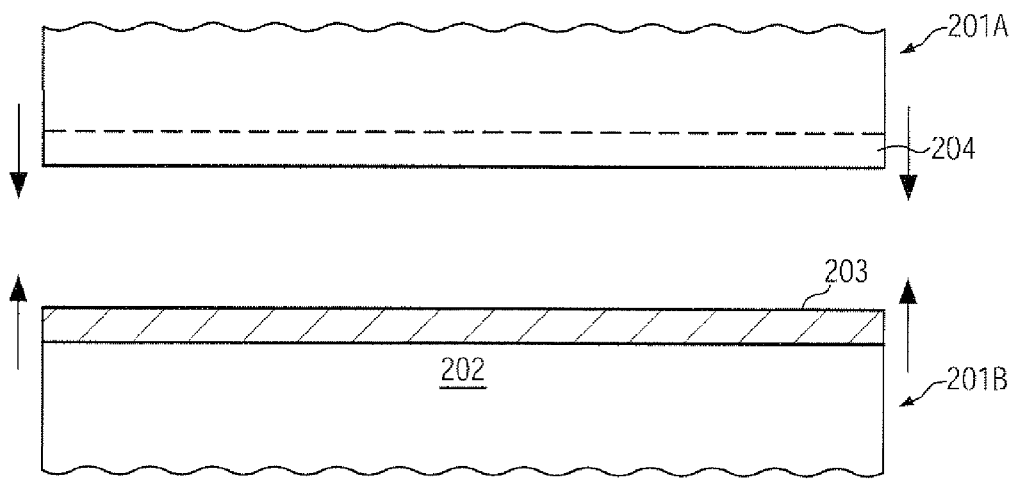
FIGS. 2a-2b schematically illustrate cross-sectional views of substrate materials including a superior buried insulating material having an increased etch resistivity to wet chemical etch recipes compared to conventional silicon dioxide materials, according to illustrative embodiments.

FIG. 2a schematically illustrates a cross-sectional view of a first substrate 201A and a second substrate 201B, which may be used to form an SOI substrate. In the manufacturing stage shown, at least one of the substrates 201A, 201B may have formed thereon a "buried" insulating material 203, which may have an etch resistivity, at least in specified portions of the material 203, that is higher compared to the etch resistivity of a silicon dioxide material, as is typically used in conventional SOI devices, as previously described with reference to the semiconductor device 100. In this context, an increased etch resistivity of the buried insulating material 203 may be understood as an etch resistivity with respect to a wet chemical agent including hydrofluoric acid (HF), wherein the resulting removal rate is at least 30% less compared to the removal rate of a thermally-grown silicon dioxide material. For example, as previously discussed, silicon nitride material formed by thermally activated or plasma assisted chemical vapor deposition (CVD) techniques may have a significantly reduced removal rate when exposed to a diluted hydrofluoric acid solution compared to a moderately pure silicon dioxide material. Similarly, silicon carbide material, nitrogen-containing silicon carbide material, or silicon dioxide-based material having incorporated therein a certain amount of additional species, such as nitrogen, carbon, fluorine and the like, may also have reduced removal rates when exposed to well-established wet chemical etch recipes. Thus, in some illustrative embodiments, the buried insulating material 203 may be formed in one or both of the substrates 201B, 201A, for instance on the substrate 201B, by using well-established manufacturing techniques in which additional components, if required, may be incorporated into the deposition ambient. In other cases, a corresponding species may be introduced into a base material of the layer 203 by ion implantation which may, in some illustrative embodiments, be applied in a later manufacturing stage, as will also be described later on in more detail. In still other illustrative embodiments, the buried insulating material 203 may be formed by oxidation, wherein a desired species may also be introduced into the oxidizing ambient in order to obtain a modified silicon oxide based material having an increased etch resistance as compared to traditional silicon dioxide. For instance, carbon, nitrogen and the like may be introduced into the oxidizing ambient on the basis of an appropriate precursor gas in order to appropriately control the concentration of the additional species. A moderately high concentration of the corresponding species, such as nitrogen, may be incorporated at an initial phase of the oxidation process, while further material may then be formed on the basis of a reduced concentration, if a corresponding high degree of compatibility of the buried insulating material 203 with respect to conventional silicon dioxide material may be desired during the further processing. Similarly, the material composition of the material 203 may be changed during a corresponding deposition process by appropriately varying the deposition parameters. In still other illustrative embodiments, a moderately thin layer may be directly formed on the "crystalline" substrate material 202 of the substrate 201B, which may provide the increased etch resistivity. Thereafter, a further dielectric material, such as silicon dioxide and the like, may be deposited. For instance, a low-k dielectric material may be formed on the previously deposited material. In still other illustrative embodiments, a low-k dielectric material, such as SiCOH, may be directly formed on the crystalline substrate material 202, which may thus provide the superior etch resistivity, wherein, if desired, one or more additional layers may be formed, for instance silicon dioxide and the like, if a high degree of process compatibility with conventional techniques is desired. In other cases, the material 203 may be substantially completely provided in the form of low-k dielectric material, thereby providing a significantly reduced capacitive coupling between the substrate material 202 and a corresponding "active" semiconductor layer 204. It should be appreciated that an appropriate dielectric material layer may also be formed "on" the semiconductor layer 204, if considered appropriate in view of a subsequent wafer bond process. For example, the buried insulating layer 203 may have formed thereon a silicon dioxide material, which may also be provided on the semiconductor layer 204, thereby providing similar process conditions as in conventional wafer bond techniques that may typically be performed on the basis of a silicon dioxide material.

Figure 2B:
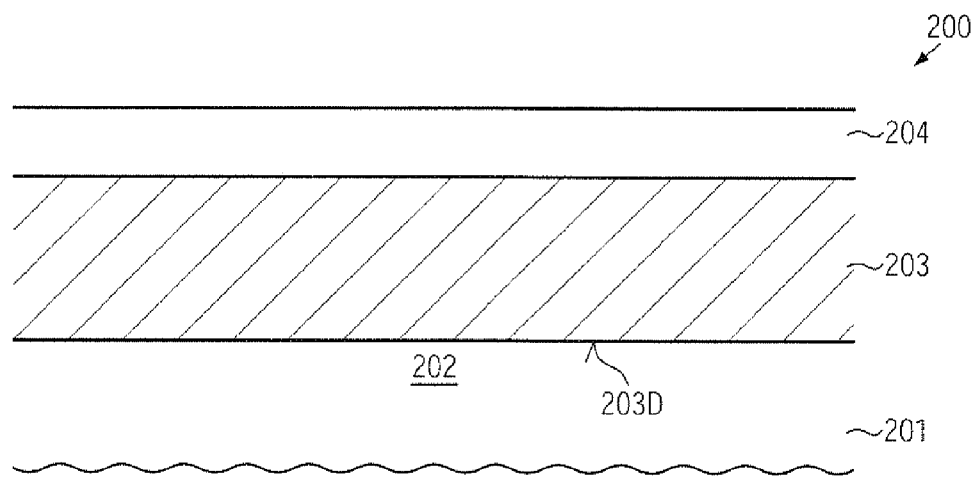

FIG. 2b schematically illustrates a combined substrate 201 of a semiconductor device 200, wherein the device 200 may comprise the buried insulating material 203 having the increased etch resistivity, at least at an interface 203D between the layer 203 and the substrate material 202, while the semiconductor layer 204 is formed on the buried insulating material 203. The device 200 as illustrated in FIG. 2b may be formed on the basis of well-established wafer bond techniques, in which the substrates 201A, 201B (FIG. 2a) may be attached to each other and joined by applying an elevated temperature and pressure. Thereafter, the substrate 201A may be cleaved, for instance, by sophisticated techniques using a previously implanted species, such as hydrogen, helium and the like, thereby providing the layer 204, which may further be treated to enhance surface characteristics thereof.

Figure 2C:
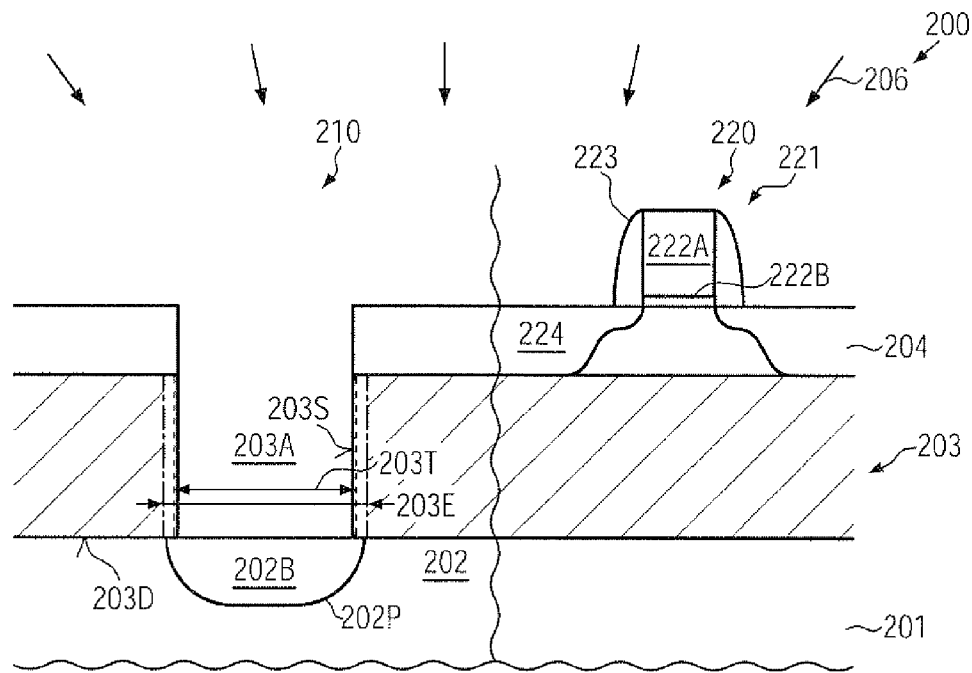
FIGS. 2c-2d schematically illustrate cross-sectional views of the semiconductor device formed on the basis of the superior buried insulating material during various manufacturing stages in forming a PN junction together with drain and source regions, according to illustrative embodiments, thereby providing increased reliability of the PN junction in the substrate material.

FIG. 2c schematically illustrates the semiconductor device 200 in an advanced manufacturing stage. As illustrated, the device 200 comprises a first device region 210, in which is formed an opening 203A that extends through the semiconductor layer 204 or any isolation structure formed therein and through the buried insulating material 203. The opening 203A may expose a doped region 202B that is delineated with respect to a surrounding portion of the crystalline substrate material 202 by a PN junction 202P. Furthermore, the device 200 may comprise a second device region 220, in which one or more circuit elements, such as a transistor 221, may be formed in and above the semiconductor layer 204. In the manufacturing stage shown, the transistor 221 may comprise drain and source regions 224, which may have a maximum dopant concentration that may substantially correspond to a maximum dopant concentration of the doped region 202P. That is, since at least a portion of the drain and source regions 224 and the doped region 202B have been formed on the basis of the same implantation process, the same type of dopant species may be incorporated with the same dose, thereby resulting in substantially the same maximum concentration. For example, the drain and source regions 224 and the doped region 202B may be formed on the basis of an N-type dopant species, when the transistor 221 represents an N-channel transistor. In this case, the doped region 202B in the first device region 210 may be surrounded by a P-type region of the material 202.

The semiconductor device 200 as shown in FIG. 2c may be formed on the basis of the following processes. The buried insulating material 203 may be formed, as was, for instance, previously described with reference to FIGS. 2a-2b, thereby providing the increased etch resistivity, at least at the interface 203D. Thereafter, further processing may be continued, for instance, by performing corresponding manufacturing processes as previously described with reference to the conventional device 100. Consequently, a high degree of compatibility with well-established process strategies may be maintained, if desired, and hence the doped region 202B, which may represent a portion of a substrate diode or any other circuit element, may be formed together with a portion of the drain and source regions 224. That is, after forming a spacer structure 223, the opening 203A may be formed using an appropriately designed etch chemistry so as to etch through the buried insulating layer 203, wherein a corresponding adaptation of the process recipe with respect to conventional silicon dioxide material may be taken into consideration. For example, a plurality of well-established anisotropic etch techniques for materials, such as silicon nitride, silicon carbide, low-k dielectric materials and the like, are available and may be used in this case. Thereafter, any anneal processes may be performed, as is previously explained, thereby attaining the PN junction 202P, and also the lateral and vertical profile of the drain and source regions 224, as may be required. Next, a wet chemical process 206 may be performed, for instance, for preparing exposed surface areas of the material 202 and of the layer 204 for receiving a metal silicide, as is also previously described. For example, the wet chemical etch process 206 may be performed on the basis of diluted hydrofluoric acid, or any other appropriate chemistry, such as ammonium hydrogen peroxide mixture (APM) and the like. Due to the increased etch resistivity of the buried insulating material 203 compared to a conventional silicon dioxide material, the lateral size of the opening 203A may be increased with a significantly less pronounced degree, thereby maintaining a width of the opening 203A within a specified range. For example, a width 203E may indicate a corresponding receding of a traditional silicon dioxide material when exposed to the ambient 206, while the width 203T may indicate a corresponding maximum allowable degree of material removal of the layer 203, which may be accomplished by providing the increased etch resistivity, as previous explained. Consequently, undue exposure of the doped region 202B at the vicinity of the PN junction 202P may be reliably avoided. Thus, in addition to enhanced reliability and performance of the PN junction 202P, increased flexibility may also be obtained in performing one or more additional wet chemical processes, such as the process 206, when effectiveness of the process 206 may have been determined as being nonacceptable, for instance, with respect to remaining contaminants and the like. Hence, in this case, one or more additional cleaning processes may be performed, as long as the resulting material removal at the sidewalls 203S may remain within the maximum allowable width 203T of the opening 203A. Consequently, yield losses may be reduced due to the possibility of repeatedly reworking devices 200 that may not meet the requirements prior to performing a silicidation process, even if the wet chemical cleaning process 206 has been performed.

Figure 2D:
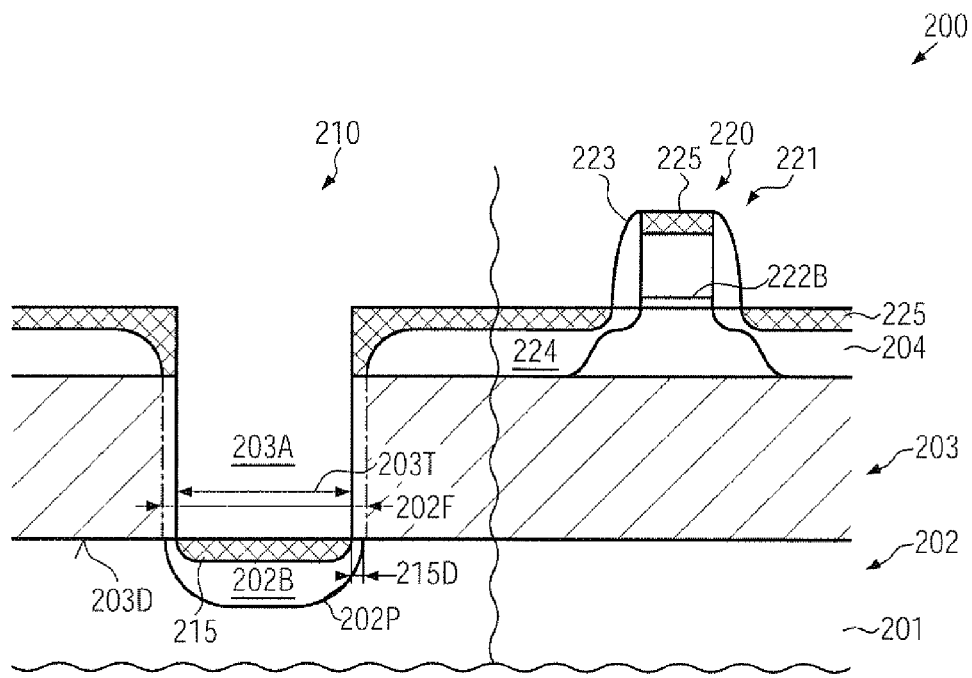

FIG. 2d schematically illustrates the semiconductor device 200 in a further advanced manufacturing stage. In this stage, metal silicide regions 225 may be formed in the first device region 220, for instance, in the drain and source regions 224 and in a gate electrode structure 221. Furthermore, a metal silicide region 215 may be formed in an exposed portion of the doped region 202B, wherein a reliable lateral offset 215D of the metal silicide 215 from the PN junction 202P may be achieved due to the maximum tolerable width 203T, which is attained on the basis of the buried insulating material 203 having the increased etch resistivity. Consequently, the PN junction 202P may be provided with enhanced reliability and thus result in superior performance, as previously explained.

Thereafter, further processing may be continued on the basis of well-established process techniques, for instance, by depositing an interlayer dielectric material, which may comprise a stressed dielectric material for enhancing performance of the transistor 221, followed by a patterning sequence for forming corresponding contacts so as to connect to the transistor 221 and the doped region 202B.

Figure 2E:
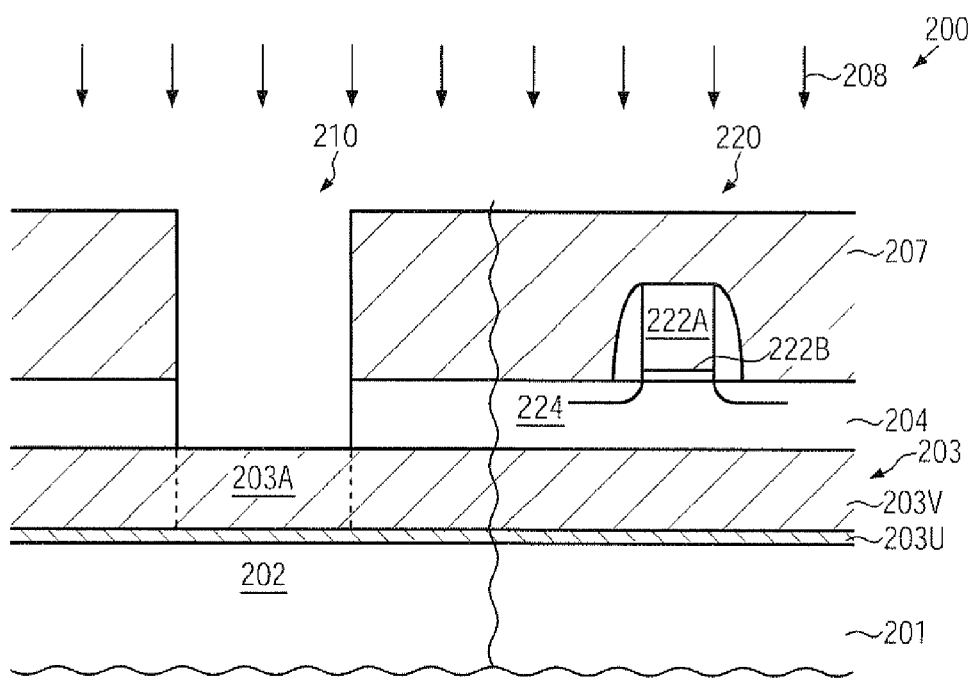
FIGS. 2e-2g schematically illustrate cross-sectional views of an SOI device during various manufacturing stages, in which a portion of the buried insulating material that is formed directly on the crystalline substrate material provides enhanced etch protection during wet chemical processes, according to illustrative embodiments.

FIG. 2e schematically illustrates the semiconductor device 200 according to further illustrative embodiments in which the buried insulating material 203 may comprise at least a first dielectric material 203U that is directly formed on the crystalline substrate material 202, followed by one or more further material layers, such as a second layer 203V. The first dielectric material 203U may be comprised of any appropriate dielectric material providing the increased etch resistivity, as previous explained. For example, the layer 203U may be provided in the form of a silicon nitride material, a silicon carbide material and the like, while the layer 203V may be formed of any other appropriate material, such as silicon dioxide, if a high degree of compatibility with conventional techniques is required, while, in other illustrative embodiments, the layer 203V may comprise a low-k dielectric material, as is also previously explained. Furthermore, in the manufacturing stage shown, the device 200 is exposed to an anisotropic etch process 208, which may be performed on the basis of an etch mask 207 covering the second device region 220 while exposing a portion of the first device region 210 in order to define the position and the lateral size of the opening 203A. For example, the etch mask 207 may be provided in the form of a resist mask.

Figure 2F:
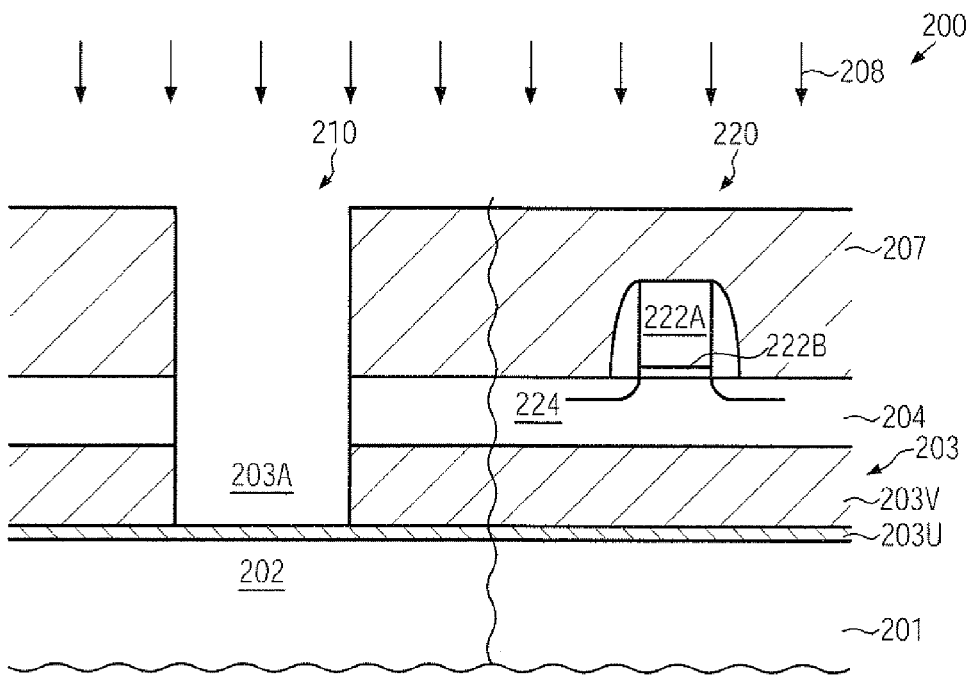

FIG. 2f schematically illustrates the semiconductor device 200 in a further advanced manufacturing stage in which the first dielectric layer 203U may additionally be used as an etch stop material during a final phase of the etch process 208. For instance, silicon nitride, silicon carbide and the like may provide a high degree of etch selectivity with respect to a plurality of dielectric materials, such as silicon dioxide, low-k dielectric materials and the like. Consequently, the etch process 208 may be controlled on the basis of the material 203U, thereby substantially avoiding undue exposure of the underlying substrate material 202. Consequently, across-substrate uniformity of the process sequence for patterning the opening 203A may be enhanced, which may also result in superior uniformity during the subsequent processing for forming the doped region and the corresponding PN junction in the substrate material 202. Thereafter, an appropriately designed etch step, for instance based on a selective anisotropic recipe, may be used for removing the exposed portion of the layer 203U. For this purpose, a plurality of well-established etch recipes are available. In other cases, even a wet chemical etch step may be used, since a thickness of the layer 203U may be selected moderately thin so that, after completing the etch process 208, an even further reduced thickness may have to be removed, thereby resulting in an acceptable degree of under-etching of the layer 203V.

Figure 2G:
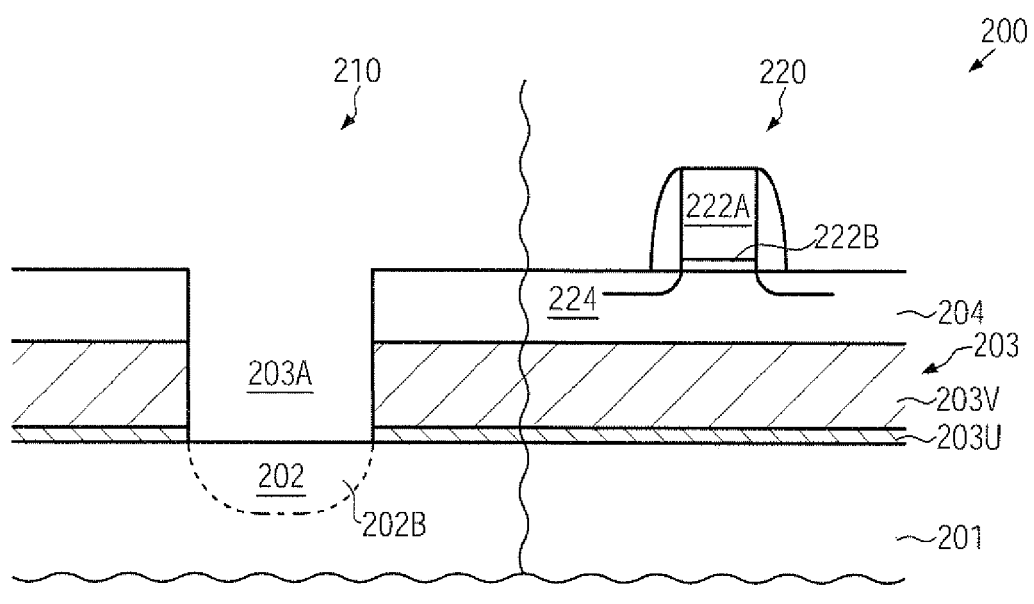

FIG. 2g schematically illustrates the semiconductor device 200 in a further advanced manufacturing stage in which the etch mask 207 (FIG. 2f) may be removed and the opening 203A may extend down to the crystalline substrate material 202. Thereafter, further processing may be continued, as previously described, for instance by forming a spacer structure and forming drain and source regions of the transistor 221 and the doped region 202B in the material 202. Thereafter, corresponding wet chemical processes may be performed, wherein at least the layer 203U may provide enhanced etch resistivity so that the width of the opening 203A, at least at a bottom thereof, may not unduly increase, as previously explained.

With reference to FIGS. 2h-2m, further illustrative embodiments will now be described in which a modification of the etch behavior of the base material may be accomplished by incorporating a specific species by ion implantation at any appropriate manufacturing stage.

Figure 2H:
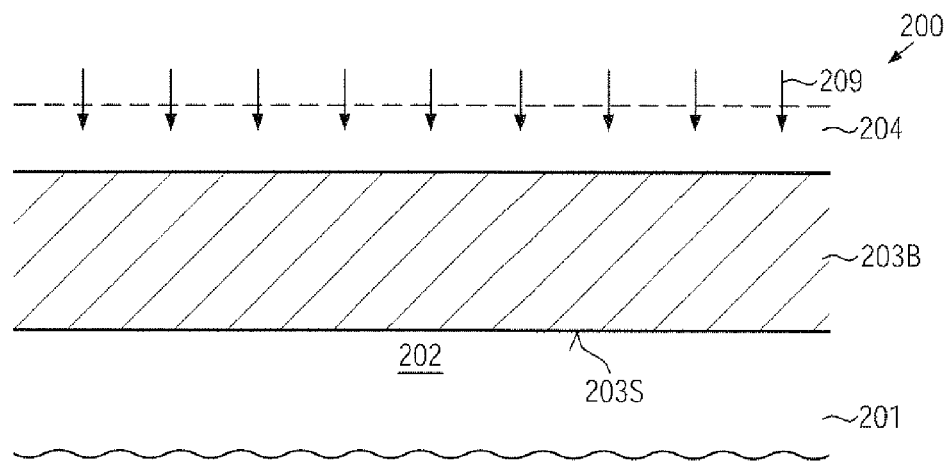
FIGS. 2h-2i schematically illustrate cross-sectional views of SOI devices in which the etch resistivity of a buried insulating material may be modified on the basis of the incorporation of an appropriate species, which may be accomplished prior to forming an active semiconductor layer or in a further advanced manufacturing stage, according to illustrative embodiments.

FIG. 2h schematically illustrates the semiconductor device 200 in which a buried base material 203B, for instance provided in the form of a silicon dioxide material, if a desired high degree of process compatibility with conventional strategies is desired, or in the form of any other appropriate material, is formed on the crystalline substrate material 202. In one illustrative embodiment, the base material 203B may be formed on a corresponding carrier substrate, as previously explained with reference to FIG. 2a, so that the semiconductor layer 204 is still to be provided on the buried base layer 203B, as indicated by the dashed lines. Furthermore, the device 200 is exposed to an ion bombardment 209 for incorporating a desired species, such as nitrogen, fluorine, carbon and the like, so as to appropriately modify the etch resistivity of the base material 203B, at least in the vicinity of the interface 203S, in view of enhancing the etch resistivity with respect to a wet chemical recipe, as previously explained. It should be appreciated that appropriate process parameters for the implantation process 209 may be readily established by simulation and/or experiments in order to obtain an appropriate degree of modification, for instance by providing a sufficient concentration of the corresponding species. In other illustrative embodiments, the semiconductor layer 204 may already be formed on the base layer 203B, when a corresponding implantation-induced damage in the material 204 is considered acceptable and may be cured in a subsequent anneal process.

Figure 2I:
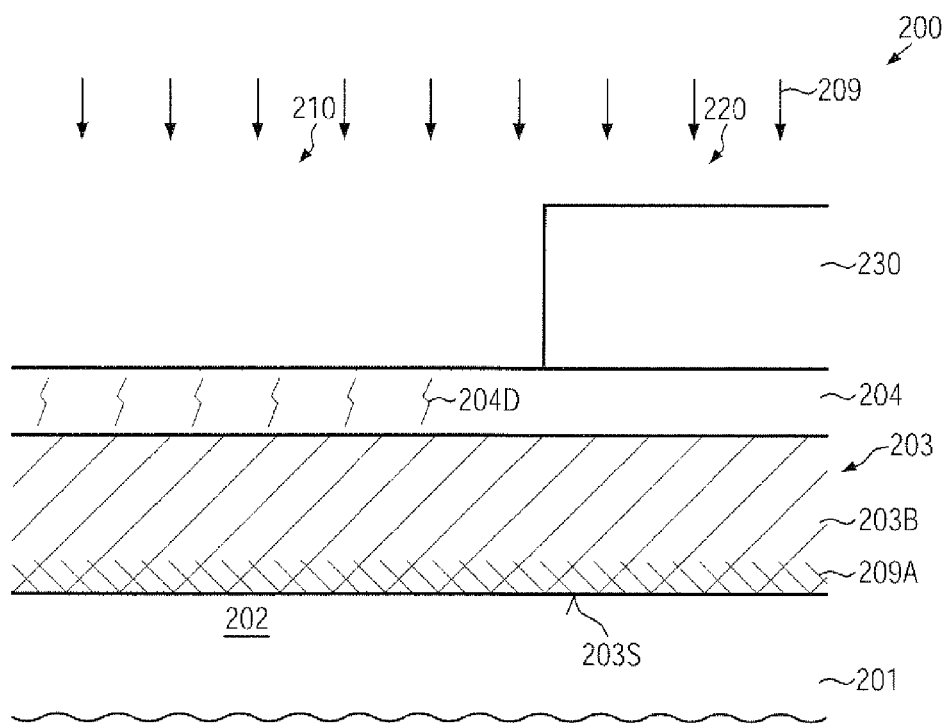

FIG. 2i schematically illustrates the semiconductor device 200 in which the implantation process 209 may be performed with the semiconductor layer 204 being located on the base layer 203B. Furthermore, an implantation mask 230 may be provided, for instance, in the form of a resist mask to cover the second device region 220 while exposing the first device region 210. It should be appreciated that the mask 230 may also cover any transistor elements formed in the second device region 220, while, in other cases, the implantation process 209 may be performed in an early manufacturing stage, for instance, prior to any fabrication processes for forming gate electrode structures and the like. Thus, implantation-induced damage as, for instance, illustrated as 204D may be restricted to the first device region 210 so that any desired species may be incorporated with a high dose in order to obtain a desired etch behavior of the base material 203B, thereby providing the buried insulating layer 203 in a locally restricted manner according to the first device region 210. For example, a species 209A may be positioned with a desired concentration at least at the interface 203S in order to appropriately modify the etch resistivity, as previously explained.

Figure 2J:
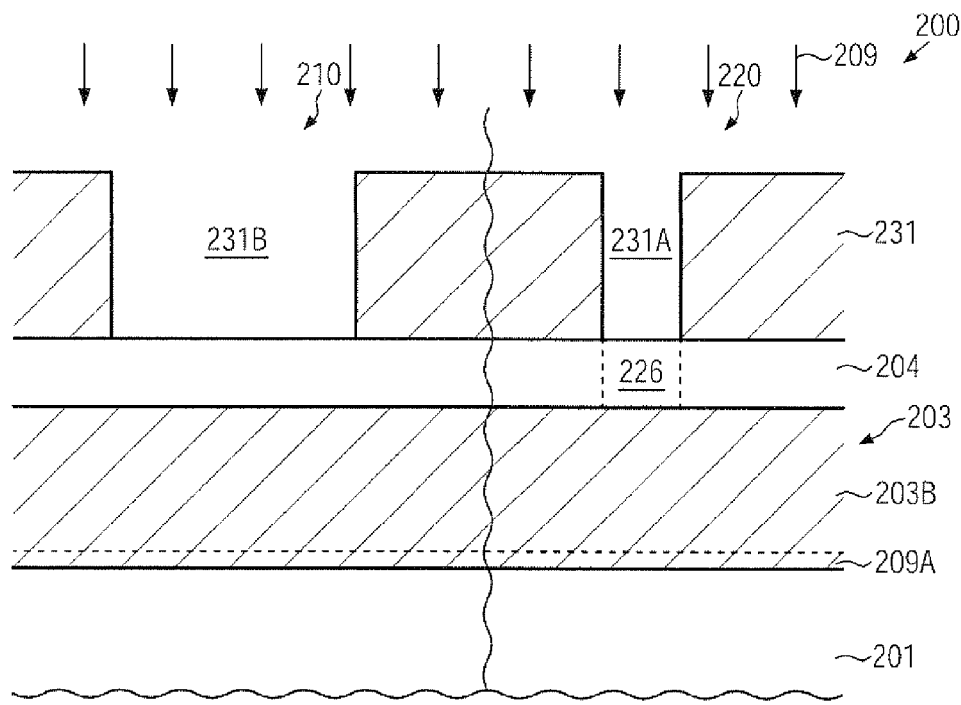
FIGS. 2j-2m schematically illustrate cross-sectional views of an SOI device in which a buried insulating material may be modified with respect to its etch resistivity by performing a masked implantation process, according to further illustrative embodiments.

FIG. 2j schematically illustrates the semiconductor device 200 according to further illustrative embodiments in which a mask 231 may be provided and may have openings 231A, 231B in order to define the position and lateral size of isolation trenches 226 in the second device region 220 while also defining an area in which an opening is to be formed through the buried insulating material 203B. In the embodiment shown, the mask 231 may be used during the ion implantation process 209 so as to introduce the species 209A, thereby increasing the etch resistivity of the base material 203B, as discussed above. Hence, any undue damage in the layer 204 in the second device region 220 may be restricted to the area of the isolation trenches 226, thereby even increasing the overall etch rate of the semiconductor material of the layer 204 during a subsequent patterning process. Similarly, corresponding damage may also be obtained in the first device region 210, thereby also resulting in an increased overall etch rate.

Figure 2K:
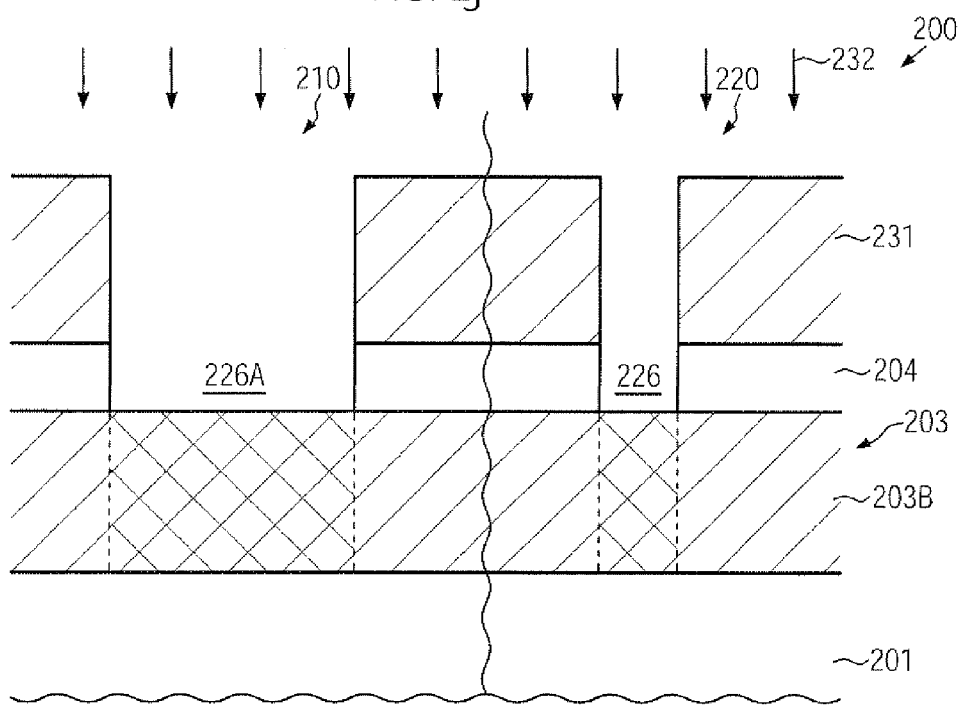

FIG. 2k schematically illustrates the semiconductor device 200 during an anisotropic etch process 232 in order to form the isolation trench 226 in the semiconductor layer 204 in the second device region 220, while also obtaining a corresponding "isolation trench" 226A in the first device region 210.

It should be appreciated that, in other illustrative embodiments, the order of the processes 209 and 232 may be reversed if the mask 231 provides sufficient etch selectivity so that a remaining thickness after the etch process 232 may be sufficient for achieving the required ion blocking effect during the implantation process 209. In this case, however, reduced implantation energies may be selected, since the implantation process 209 may be performed on the basis of the trenches 226A, 226. Thereafter, the mask 231 may be removed and further processing may be continued by appropriately filling the trenches 226, 226A.

Figure 2L:
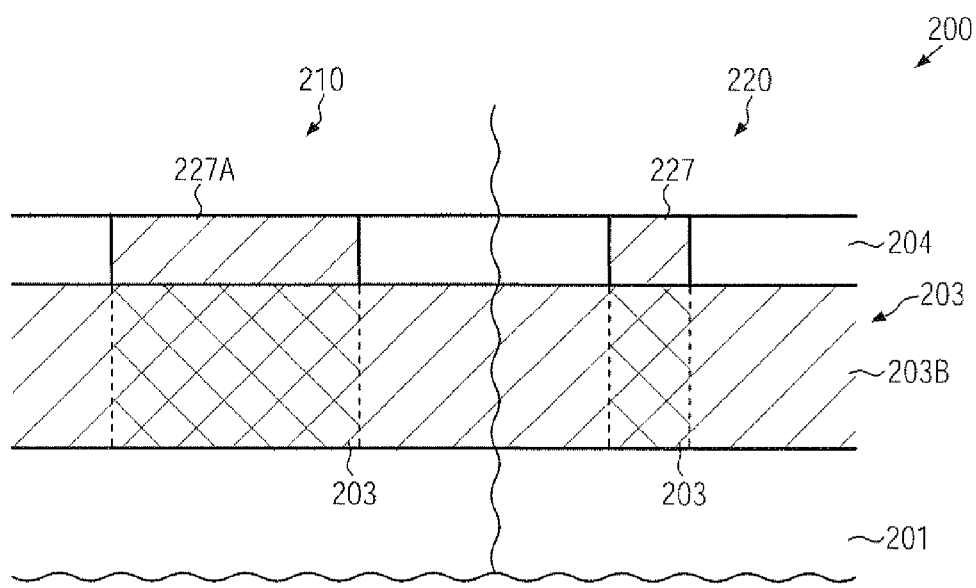

FIG. 2l schematically illustrates the semiconductor device 200 with corresponding isolation structures 227, 227A, which may be filled with silicon dioxide and the like, as is required by the overall device requirements. For this purpose, appropriate oxidation and deposition techniques may be used for providing a fill material and thereafter any excess material may be removed in order to obtain the isolation structures 227, 227A as illustrated. Furthermore, the buried insulating material 203 is formed below the isolation structures 227A, 227 due to the preceding implantation process 209 (FIG. 2j).

Consequently, the buried insulating material 203 may be provided in a locally restricted manner on the basis of an ion implantation process without creating undue crystalline damage in the semiconductor layer 204 in the second device region 220, and without requiring an additional photolithography process. Thereafter, further processing may be continued by forming gate electrode structures and the like, as previously described.

Figure 2M:
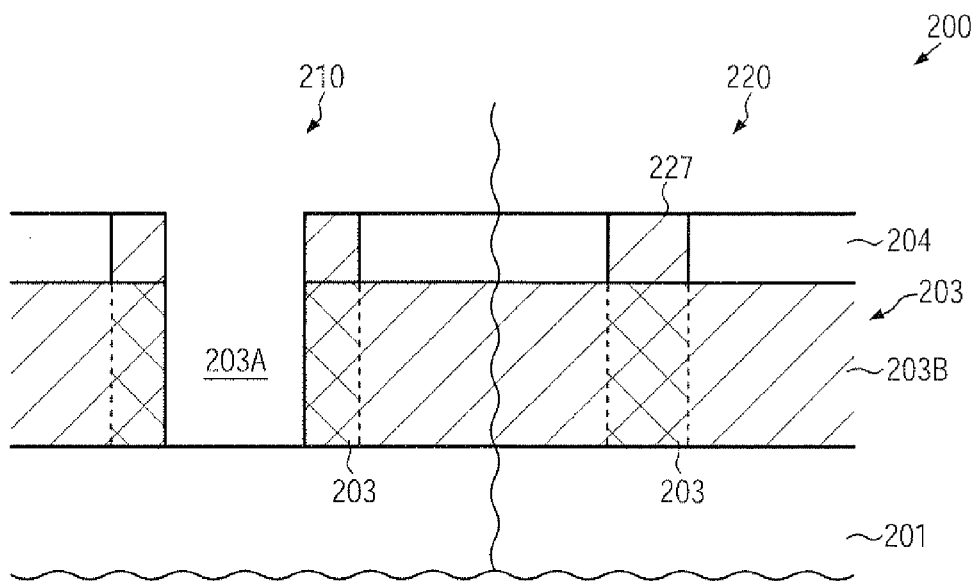

FIG. 2m schematically illustrates the semiconductor device 200 in a further advanced manufacturing stage. As illustrated, the opening 203A is formed so as to extend through the isolation structure 227A and through the buried insulating material 203. The opening 203A may be formed on the basis of well-established anisotropic etch techniques, as previously described. Thereafter, a dopant species may be incorporated, as previously described, and subsequently one or more wet chemical etch or cleaning processes may be performed, wherein the buried insulating material 203 may provide enhanced etch behavior, as previously described.

As a result, the present disclosure provides semiconductor devices and techniques in which enhanced reliability and performance of PN junctions formed in a crystalline substrate material may be achieved in SOI devices by providing the buried insulating material at least locally with increased etch resistivity with respect to wet chemical chemistries as compared to traditional silicon dioxide. Consequently, an undue receding of the buried insulating material may be reduced and may thus be maintained within a well-defined range, thereby reducing the probability of creating short circuits or unduly affecting the overall characteristics of the PN junction.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a semiconductor device, the method comprising:
    providing a buried insulating material formed above a crystalline substrate material at least in a first device region, said buried insulating material having an increased etch resistivity as compared to silicon dioxide formed by an oxidation process with respect to a wet chemical cleaning recipe to be performed prior to forming a metal silicide in said crystalline substrate material and a semiconductor layer formed above said crystalline substrate material in at least a second device region;
    forming an opening through said buried insulating material in said first device region so as to expose a portion of said crystalline substrate material;
    forming drain and source regions of a transistor in said semiconductor layer in said second device region and a doped region in said crystalline substrate material exposed by said opening in a common implantation process;
    performing one or more cleaning processes on the basis of said wet chemical cleaning recipe; and
    forming said metal silicide in said transistor and said doped region.

2. The method of claim 1, wherein said buried insulating material is provided at least in said first device region so as to have a lower removal rate compared to silicon dioxide material when performing one or more cleaning processes.

3. The method of claim 1, wherein providing said buried insulating material at least in said first device region comprises forming an insulating material other than silicon dioxide on said crystalline substrate material.

4. The method of claim 3, wherein said insulating material other than silicon dioxide comprises a low-k dielectric material.

5. The method of claim 3, wherein said insulating material other than silicon dioxide comprises at least one of nitrogen and carbon.

6. The method of claim 1, wherein providing said buried insulating material at least on said first device region comprises forming a first dielectric layer on said crystalline substrate material and forming a second dielectric layer on said first dielectric layer, wherein said first dielectric layer has said increased etch resistivity.

7. The method of claim 6, wherein forming said opening comprises forming a first opening in said second dielectric layer and using said first dielectric layer as an etch stop layer.

8. The method of claim 5, further comprising forming a spacer element on sidewalls of said first and second openings prior to forming said metal silicide.

9. The method of claim 1, wherein providing said buried insulating material comprises forming a base material on said crystalline substrate material and incorporating at least locally in said first device region a species so as to obtain said increased etch resistivity.

10. The method of claim 9, wherein said species is incorporated when forming said base material.

11. The method of claim 9, wherein said species is incorporated after forming said semiconductor layer on said base material.

12. The method of claim 9, wherein said species is incorporated by performing an implantation process.

13. The method of claim 12, further comprising forming a mask for defining isolation structures in said second device region and exposing said first device region and performing said implantation process on the basis of said mask.

14. The method of claim 13, further comprising forming trenches of said isolation structures on the basis of said mask.

15. A method, comprising:
    forming a buried insulating layer so as to have at least locally a higher etch resistivity than silicon dioxide with respect to a wet chemical etch process;
    treating a surface portion of a crystalline substrate material of a semiconductor device by performing said wet chemical process, said surface portion being exposed by an opening extending through said insulating layer to said crystalline substrate material;
    using at least a portion of said buried insulating layer as an etch protection material during said wet chemical process so as to maintain a width of said opening at least at a bottom thereof within a predefined range; and
    forming a metal silicide in said exposed portion of the crystalline substrate material.

16. The method of claim 15, further comprising forming a doped region in said exposed portion of the crystalline substrate material and forming drain and source regions of a transistor in a common implantation process, wherein said transistor is provided in and above a semiconductor layer formed above said buried insulating layer.

17. The method of claim 15, wherein forming said buried insulating layer comprising depositing a low-k dielectric material on said crystalline substrate material.

18. The method of claim 15, wherein forming said buried insulating layer comprises forming an oxide base material and incorporating at least locally a species for increasing an etch resistivity of said oxide base material.

19. The method of claim 15, wherein forming said buried insulating layer comprises forming a first dielectric material on said crystalline substrate material and forming a second dielectric material on said first dielectric material, wherein said first dielectric material has an increased etch resistivity compared to said second dielectric material when performing said wet chemical process.

20. The method of claim 19, further comprising forming said opening by etching through said second dielectric material and using said first dielectric material as an etch stop material.

* * * * *